United States Patent
Hwang et al.

(10) Patent No.: US 7,226,270 B2
(45) Date of Patent: Jun. 5, 2007

(54) APPARATUS FOR TRANSFERRING SEMICONDUCTOR DEVICE IN HANDLER

(75) Inventors: Hyun Joo Hwang, Kyonggi-do (KR); Ji Hyun Hwang, Kyonggi-do (KR)

(73) Assignee: Mirae Corporation, Chungchongnam-do (KR)

( * ) Notice: Subject to any disclaimer, the term of this patent is extended or adjusted under 35 U.S.C. 154(b) by 0 days.

(21) Appl. No.: 10/316,054

(22) Filed: Dec. 11, 2002

(65) Prior Publication Data

US 2003/0113197 A1    Jun. 19, 2003

(30) Foreign Application Priority Data

Dec. 17, 2001  (KR)  .................. 10-2001-0080160

(51) Int. Cl.
*B25J 13/00*     (2006.01)
(52) U.S. Cl. ................ 414/749.1; 198/468.3; 901/16
(58) Field of Classification Search ............ 414/749.1; 198/468.3, 619; 901/8, 16
See application file for complete search history.

(56) References Cited

U.S. PATENT DOCUMENTS 5,520,502 A * 5/1996 Liljengren et al. ............ 901/16
5,950,802 A * 9/1999 Kubota .................... 198/468.3
5,980,193 A * 11/1999 Clifton et al. ............ 414/749.2
6,194,859 B1 * 2/2001 Everman et al. .......... 901/16 X
6,464,069 B1 * 10/2002 Rich et al. ................ 198/468.3

FOREIGN PATENT DOCUMENTS

KR    1020010009436    2/2001

* cited by examiner

*Primary Examiner*—Donald Underwood
(74) *Attorney, Agent, or Firm*—Ked & Associates, LLP

(57) ABSTRACT

An apparatus for transferring semiconductor devices in a semiconductor device handler is provided which simplifies set up procedures when a species of device to be tested, and the associated change kit, is changed. A reference picker and three variable pickers are positioned within the framing structure of the handler, with the motion of the third variable picker synchronized relative to the motion of the first and second variable pickers. A plurality of sensors determine an initial position of the variable pickers, and then motion of the variable pickers is monitored by respective scanning heads and linear scales until a new setup position which corresponds to the new device species is attained. In this manner, the procedure and structure for varying position and pitch of the various pickers can be simplified, thus reducing processing time and cost.

16 Claims, 6 Drawing Sheets

APPARATUS FOR TRANSFERRING SEMICONDUCTOR DEVICE IN HANDLER

This application claims the benefit of the Korean Application No. P2001-80160 filed on Dec. 17, 2001, which is hereby incorporated by reference.

BACKGROUND OF THE INVENTION

1. Field of the Invention

The present invention relates to an apparatus for picking up to transfer semiconductor devices in a handler for testing the semiconductor devices, and more particularly, to an apparatus for transferring semiconductor devices in a semiconductor device test handler enabling to facilitate to vary pitches of pickers for picking up the semiconductor devices to correspond to a tray and change kits according to species and sizes of the semiconductor devices to be tested.

2. Discussion of the Related Art

Generally, semiconductor devices produced in a production line undergo tests for checking whether to be good or fail before shipment.

A handler is a device for testing such semiconductor devices. The handler uses a semiconductor device transferring apparatus to transfer semiconductor devices received on a tray to another site in the course of a process automatically, loads the semiconductor devices on a test socket of a test site to carry out a demanded test thereon, and classifies the tested semiconductor devices into various grades to unload them on the tray. The handler carries out such steps repeatedly to perform the tests.

FIG. 1 illustrates a layout of a general handler for semiconductor device test.

Referring to FIG. 1, in a front part of a handler body 1, formed are a loading unit 2 on which trays receiving test-expecting semiconductor devices thereon are loaded and an unloading unit 3 having a plurality of trays receiving test-completed semiconductor devices classified into good products and re-examining products in accordance with test results. And, a soaking plate 7 is installed in rear of the loading unit 2. The soaking plate 7 includes a heating means (not shown in the drawings) and a cooling means(not shown in the drawings) inside to heat or cool the test-expecting semiconductor devices to a predetermined temperature for temperature test.

And, a reject multi-stacker 5, on which a plurality of trays are loaded to receive the semiconductor devices classified by grade into the failed products according to the test results, is installed in rear of the unloading unit 3.

In a test site 10 located at the foremost rear part of the handler body 1, a test socket 11 connected electrically to an external testing device is installed to test a performance of each of the semiconductor devices. Over the test sockets 11, formed are first and second index heads 12a and 12b installed to move horizontally to pick up to load the semiconductor devices; which are transferred to standby positions at both sides of the test sockets 11, on the test sockets 11 as well as to pick up to retransfer the tested semiconductor devices on the test sockets 11 to the standby positions at both sides.

In the very front of the test site 10, first and second loading shuttles 8a and 8b are installed to move back and forth. The first and second loading shuttles 8a and 8b receive to transfer the semiconductor devices from the loading unit 2 or the soaking plate 7 to the standby positions at both sides of the test sockets 11 of the test site 10. At one sides of the first and second loading shuttles 8a and 8b, first and second unloading shuttles 9a and 9b are installed to move back and forth, respectively. The fist and second unloading shuttles 9a and 9b receive to transfer the test-completed semiconductor devices from the test site 10 to an outside of the test site 10.

Fixing frames 13 are installed at the front end of the handler body 1 and over the very front side of the test site 10 across the handler body 1, respectively. A pair of movable frames 14a and 14b are installed at the fixing frames 13 to move right and left along the fixing frames 13. And, loading and unloading pickup device 15 and 16 are installed at the movable frames 14a and 14b to move back and forth along the movable frames 14a and 14b to pick up semiconductor devices, respectively. Each of the loading and unloading pickup devices 15 and 16 includes a plurality of pickers (not shown in the drawings) to transport a plurality of the semiconductor devices simultaneously.

Meanwhile, a handler is constituted to carry out a test on such semiconductor devices as QFP, BGA, SOP, and the like. After one species of the semiconductor devices have been tested, another species of the semiconductor devices are tested. In such a case, a change kit including the tray, soaking plate 7, loading shuttles 8a and 8b, unloading shuttles 9a and 9b, test socket 11, and the like is replaced by another change kit fitting to the semiconductor device species to carry out the test.

In this case, since the change kits replaced according to the species of the test-expecting semiconductor devices differ from each other in pitches and sizes of landing units where the semiconductor devices land, pitches of the pickers of the loading and unloading pickup devices 15 and 16 should be varied to fit those of the landing units.

However, the loading and unloading pickup devices 15 and 16 according to the related art use driving means including mechanical links, belts, ball screws, and servomotors, and the like to vary their pickers, respectively. Hence, the driving means are too complicated to change a rotary motion into a straight motion to increase their overall volumes, whereby power consumption increases.

Moreover, when the belts and pulleys are used, tensions of the belts should be adjusted periodically. Besides, the operating belts and pulleys raise dust to have bad influence on the semiconductor devices.

SUMMARY OF THE INVENTION

Accordingly, the present invention is directed to an apparatus for transferring semiconductor devices in a semiconductor device that substantially obviate one or more problems due to limitations and disadvantages of the related art.

An object of the present invention is to provide an apparatus for transferring semiconductor devices in a semiconductor device enabling to simplify the structure for varying pickers for picking up semiconductor devices as well as accomplish fast and precise variation of the pickers.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an apparatus for transferring semiconductor devices in a handler according to the present invention includes rectangular frames installed movably on a handler body, stators of two linear motors installed on inner sides of two of the frames adjacent to each other, respectively, movers of the two linear motors installed to move along the stators, respectively, a reference pickup member fixed to an inner corner between the frames where the linear motors meet each other to pick up the semiconductor device, first and second pickup members coupled with the movers of the linear motors to move along the frames, respectively, a first guide member fixed to the first pickup member to be in parallel with the frame having the second pickup member installed thereat, a second guide member fixed to the second pickup member to be vertical the first guide member, and a third pickup member coupled with both of the first and second guide members to move along the second and first guide members by movements of the first and second pickup members.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

In the following description, a constitution of a handler, to which an apparatus for transferring semiconductor devices according to the present invention is applied, refers to that of the handler according to the related art and its detailed description is skipped.

Figure 2:
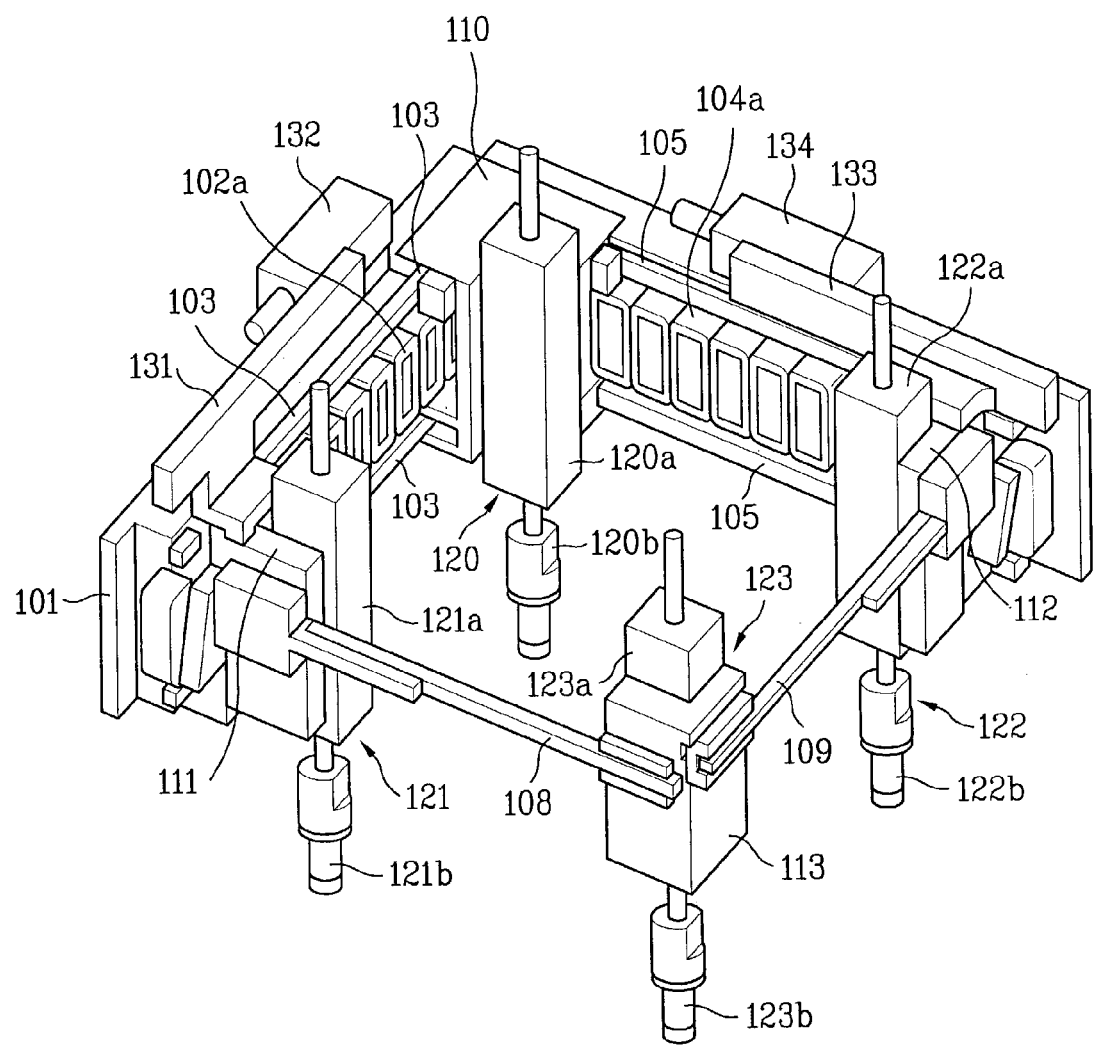
FIG. 2 illustrates a bird's-eye view of an apparatus for transferring semiconductor devices according to a first embodiment of the present invention excluding a frame in part.
Figure 3:
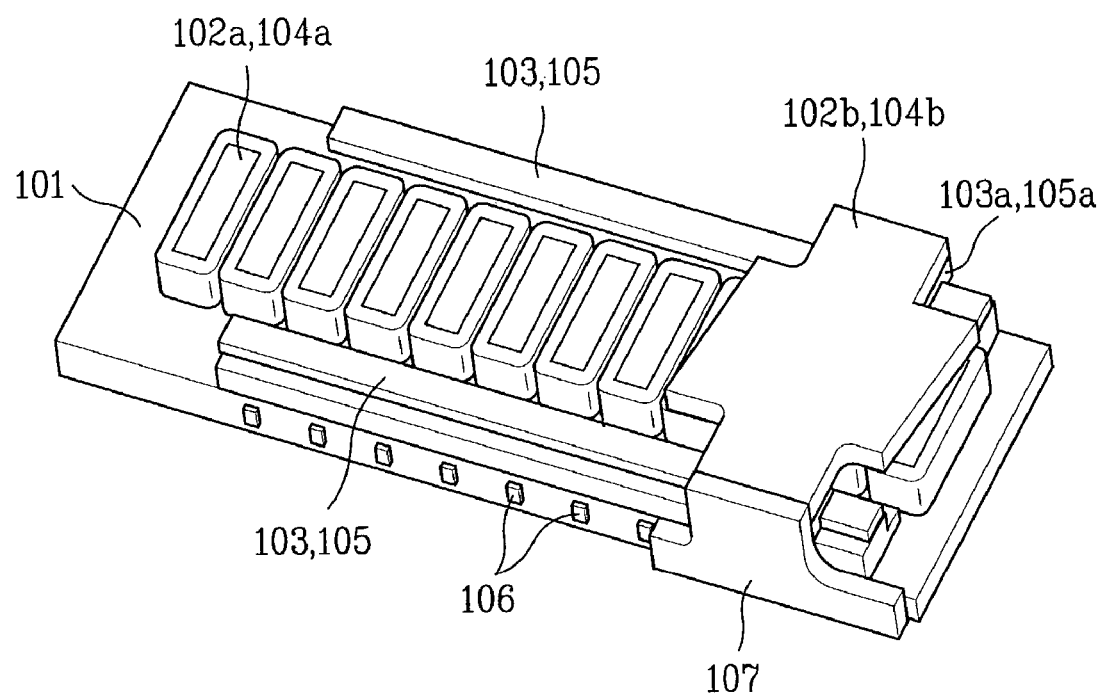
FIG. 3 illustrates a bird's-eye view of a picker driving unit of the transferring apparatus in FIG. 2.
Figure 4A:
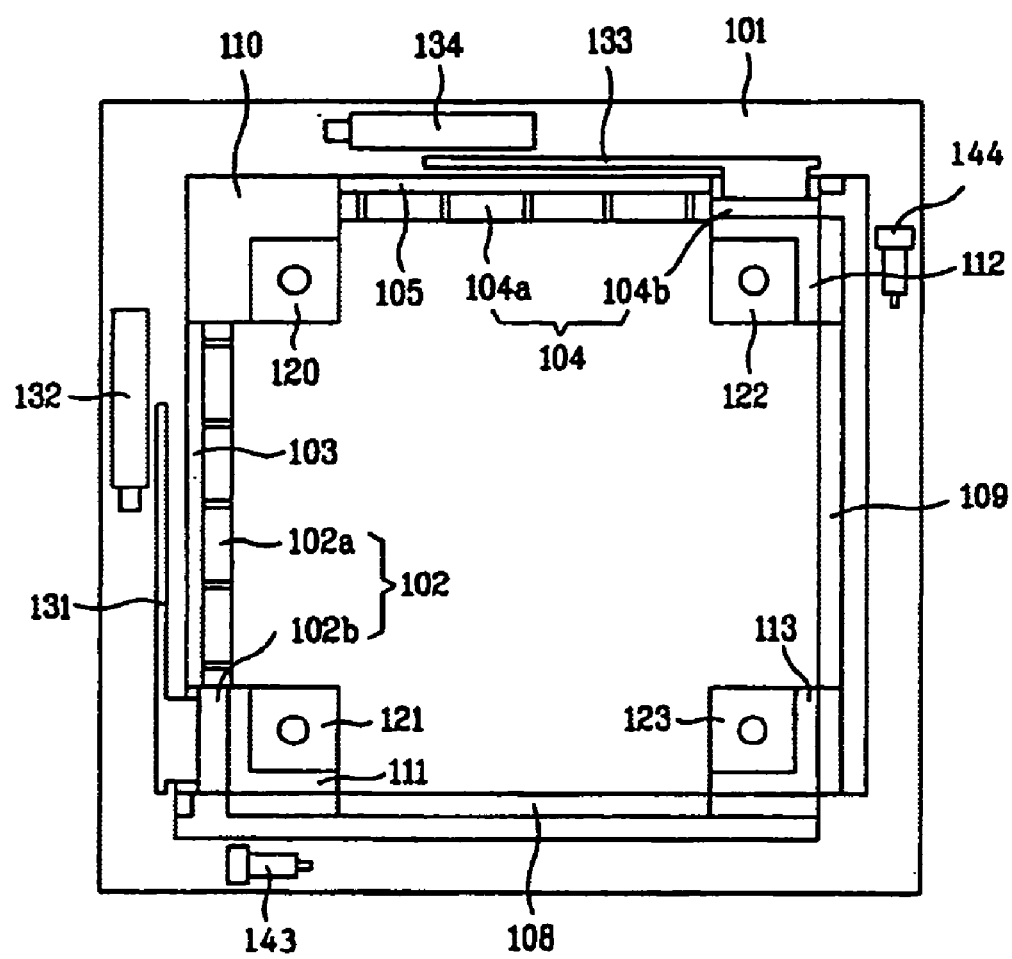
FIG. 4A and FIG. 4B illustrate layouts for explaining operation of an apparatus for transferring semiconductor devices according to the present invention.
Figure 4B:
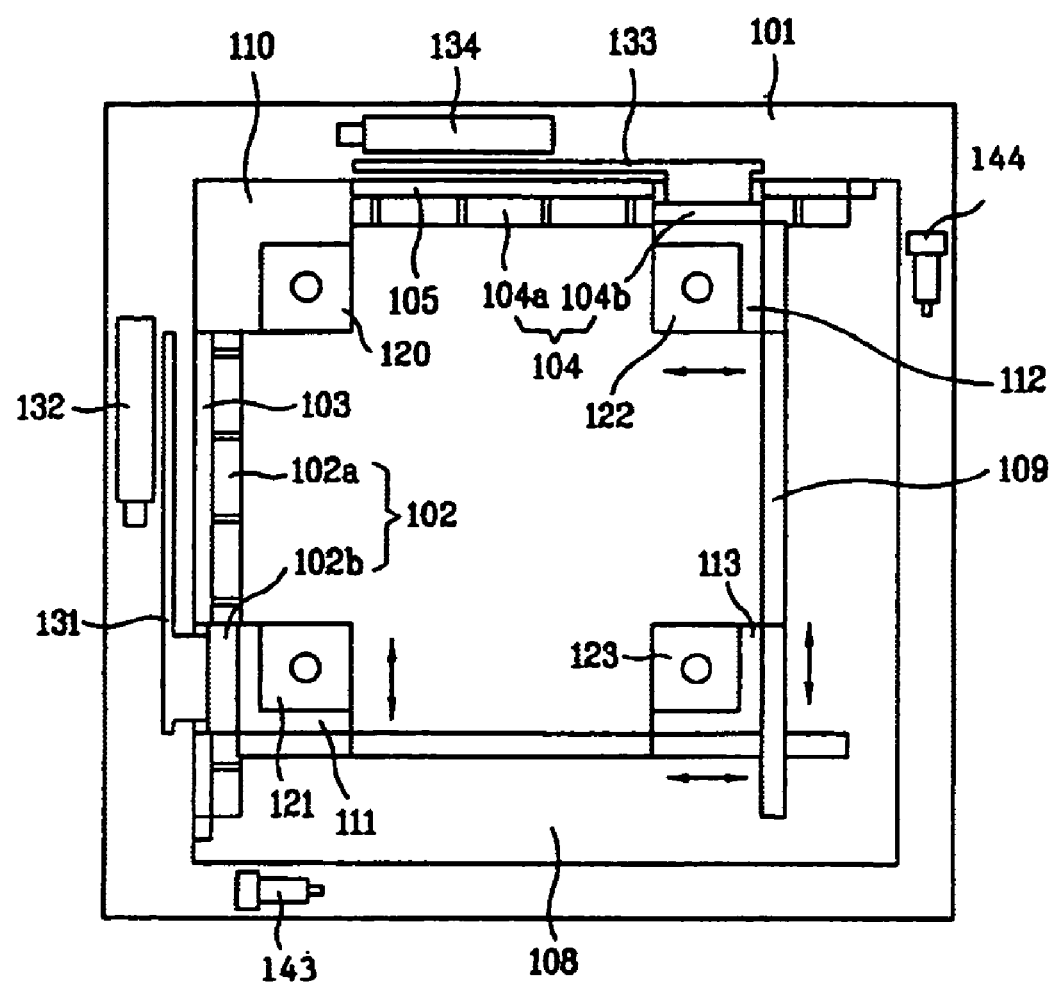

FIG. 2 illustrates a bird's-eye view of an apparatus for transferring semiconductor devices according to a first embodiment of the present invention excluding a frame in part, FIG. 3 illustrates a bird's-eye view of a picker driving unit of the transferring apparatus in FIG. 2, and FIG. 4A and FIG. 4B illustrate layouts for explaining operation of an apparatus for transferring semiconductor devices according to the present invention.

Figure 1:
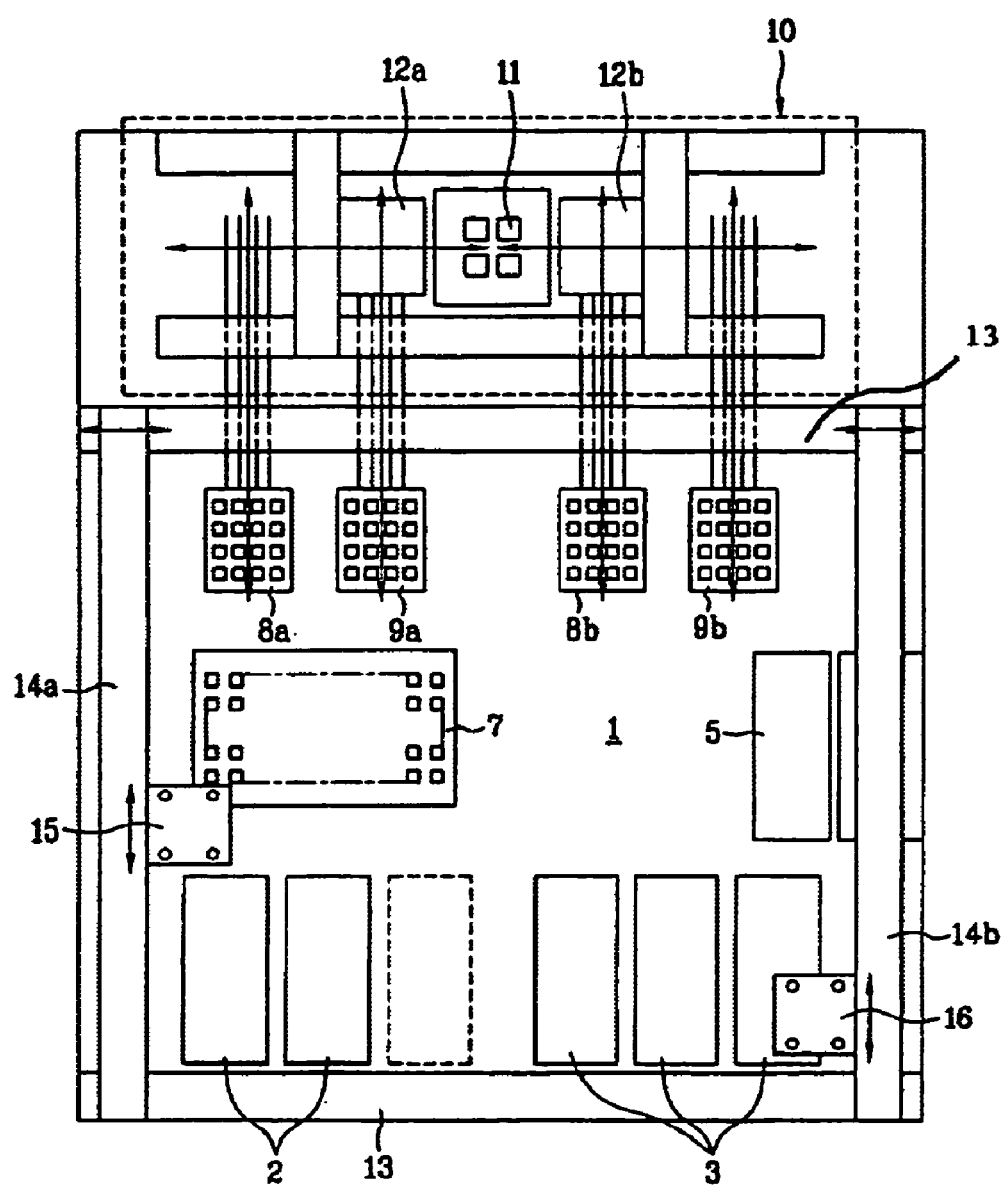
FIG. 1 illustrates a layout of a general handler for semiconductor device test.

Rectangular frames 101 are fixed to movable frames 14a and 14b (cf. FIG. 1). Stators 102a and 104a and movers 102b and 104b of two linear motors 102 and 104 are installed at both neighboring inner sides of the frames 101, respectively. And, the movers 102b and 104b are coupled under the stators 102a and 104a with LM blocks 103a and 105a of LM guides 103 and 105 installed in parallel with the frame to move along the LM guides 103 and 105, respectively.

A fixing block 110 is fixed to a corner between the frames 101 where the stators 102a and 104a of the linear motors 102 and 104 meet each other, and a reference picker 120 picking up a semiconductor device is fixed to the fixing block 110.

'L' type first and second movable blocks 111 and 112 are fixed to the movers 102b and 104b of the linear motors 102 and 104, respectively. And, first and second variable pickers 121 and 122 picking up another semiconductor devices are installed at the first and second movable blocks 111 and 112, respectively.

Moreover, a first guide member 108 is fixed to one side of the first movable block 111 to be in parallel with the linear motor 104 having the second variable picker 122 installed thereat, and a second guide member 109 is fixed to one side of the second movable block 112 to be in parallel with the linear motor 102 having the first variable picker 121 installed thereat. The first guide member 108 is installed to a level lower than that of the second guide member 109, whereby such that the first and second guide members 108 and 109 do not meet.

A third movable block 113, to which a third variable picker 123 picking up a semiconductor device is fixed, is coupled with both of the first and second guide members 108 and 109. When the first movable block 111 moves, the third movable block 113 moves along the second guide member 109. When the second movable block 112 moves, the third movable block 113 moves along the first guide member 108.

The reference picker 120 and the first to third variable pickers 121, 122, and 123 are constructed to have the same shapes, and include cylinders 120a~123a fixed to the fixing block 110 and the moving blocks 111, 112, and 113, respectively and nozzle head units 120b~123b installed at lower ends of the cylinders 120a~123a to move upward and downward to absorb the semiconductor devices by vacuum suction, respectively.

Meanwhile, a plurality of hall sensors 106 of magnetic field sensors are installed at lower ends of the frames 101 having the stators 102a and 104a of the linear motors 102 and 104 installed thereat to leave a predetermined interval from each other. Hence, the hall sensors 106 detect the current positions of the first and second variable pickers 121 and 122 before the linear motors 102 and 104 are driven. And, sensing pieces 107 extending toward a plurality of the hall sensors 106 are coupled with lower ends of the movers 102b and 104b of the linear motors 102 and 104, respectively to be detected by the hall sensors 106.

Moreover, in order to precisely control the movements of the movers 102b and 104b of the linear motors 102 and 104 by detecting displacements of the first and second variable pickers 121 and 122 when the linear motors 102 and 104 are driven, linear scales 131 and 133 are fixed to upper ends of the movers 102b and 104b of the linear motors 102 and 104, respectively and scanning heads 132 and 134 encoding numerical values of the linear scales 131 and 133 are installed on upper ends of the frames 101 having the linear motors 102 and 104 installed thereat, respectively.

And, a pair of limit sensors 143 and 144 are installed on the upper ends of the frames 101 to prevent overrun of the pickers by restricting final moving ranges of the first and second variable pickers 121 and 122. The limit sensors 143 and 144 are used for a home checking operation as well. The home checking operation is carried out to set the moving ranges of the variable pickers 121, 122, and 123 and transfer them to a control unit (not shown in the drawings) by initially moving the first and second variable pickers 121 and 122 and the third variable picker 123 interoperating with them from the closest points to the farthest points of operation after the apparatus for transferring the semiconductor devices have been loaded on the handler.

Operation of the above-constituted apparatus for transferring the semiconductor devices is explained as follows.

After one species of the semiconductor devices has been tested, if another species of the semiconductor devices is to be tested, the change kits on which the respective devices are mounted should be replaced in accordance with the corresponding sizes and species of the semiconductor devices as well as the pitches of the pickers 120 to 123 of the apparatus for transferring the semiconductor devices should be varied to correspond to pitches of the replacing change kits, respectively.

Once a user inputs specifications of the replacing change kits to the unit (not shown in the drawings) of the handler, the control unit checks the current positioning statuses of the first and second variable pickers 121 and 122 by the hall sensors 106 installed at the frames 101 and then drives the linear motors 102 and 104 to move the variable pickers 121, 122, and 123 a set amount from the current positions so as to be disposed at the required positions.

Namely, having detected the current positions of the first and second variable pickers 121 and 122 on the frames 101, the control unit (not shown in the drawings) drives the linear motors 102 and 104. The first and second variable pickers 121 and 122 are then guided by the LM guides 103 and 105 to move away in setup directions, respectively. In this case, the third variable picker 123 is synchronized by the movements of the first and second variable pickers 121 and 122 to move along the second and first guide members 109 and 108.

When the first and second variable pickers 121 and 122 move as the movers 102b and 104b of the linear motors 102 and 104 move, the scanning heads 132 and 134 encode to transfer the displacements of the linear scales 131 and 133 attached to the respective movers 102b and 104b to the control unit (not shown in the drawings). Thus, the control unit enables to monitor the displacements of the first and second variable pickers 121 and 122 continuously. Hence, when the first and second variable pickers 121 and 122 reach the demanded positions, the control unit (not shown in the drawings) stops operating the linear motors 102 and 104, thereby enabling to transfer the first to third variable pickers 121 to 123 to the demanded positions exactly.

It is preferable to drive a pair of the linear motors 102 and 104 simultaneously for time reduction. Yet, the linear motors can be driven sequentially with a time difference as well.

Figure 5:
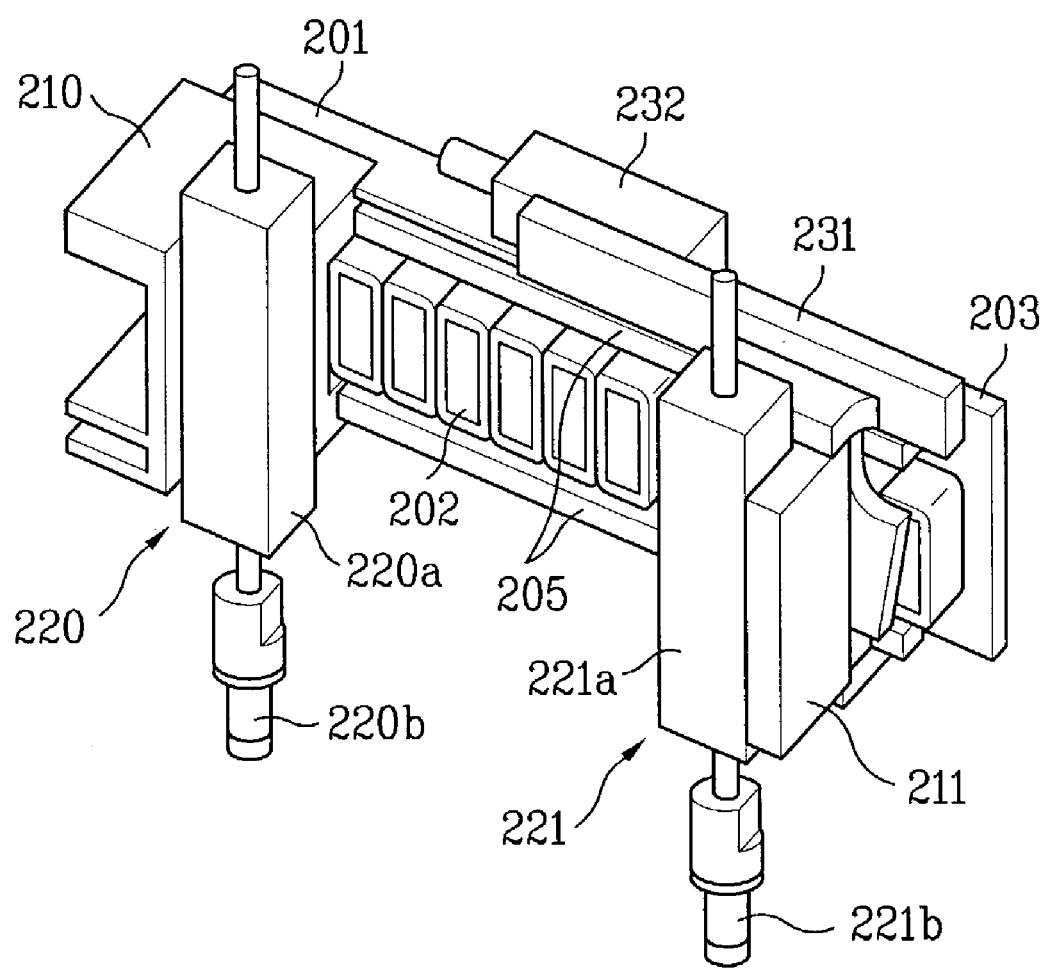
FIG. 5 illustrates a bird's-eye view of an apparatus for transferring semiconductor devices according to a second embodiment of the present invention.

FIG. 5 illustrates a bird's-eye view of an apparatus for transferring semiconductor devices according to a second embodiment of the present invention, in which the transferring apparatus includes a pair of pickers.

Referring to FIG. 5, a fixing block 210 is fixed to one end of a base plate 201 fixed to movable frames of a handler. A reference picker 220 with a cylinder 220a and nozzle head unit 220b is installed at the fixing block 210. And, a stator 202 and a mover 203 are installed at the base plate 201 to a side of the fixing block 210.

In this case, the mover 203 of the linear motor is coupled with an LM guide 205 installed in parallel with upper and lower sides of the base plate 201 to move horizontally along the base plate 201.

A movable block 211 is fixed to the mover 203, and a variable picker 221 with a cylinder 221a and nozzle head unit 221b is fixed to the movable block 221.

Moreover, like the transferring apparatus according to the first embodiment of the present invention, a linear scale 231 is coupled with an upper end of the mover 203 to control a displacement of the variable picker 221 and a scanning head 232 is installed on an upper end of the base plate 201 to encode a numerical value of the linear scale 231.

Besides, a plurality of hall sensors (not shown in the drawing) are arranged to leave a predetermined interval from each other on a lower end of the base plate 201, and a sensing piece (not shown in the drawing) extending toward the hall sensors is coupled with a lower end of the mover 203.

Operation of the above-constituted transferring apparatus according to the second embodiment of the present invention is accomplished more simply than that of the first embodiment of the present invention. And, the above-constituted transferring apparatus according to the second embodiment of the present invention facilitates to transfer two of the semiconductor devices simultaneously.

Accordingly, the linear motors are used as means for driving a plurality of pickers, and several pickers are interoperated simultaneously by the least linear motors.

Therefore, the present invention enables to simplify the structure of the transferring apparatus as well as reduce its size and weight.

Moreover, the use of the linear motor(s) prevents dust from being generated when the pickers are varied in position, reduces noise to facilitate its maintenance, and transfers the picker to the demanded position fast and precisely to improve test efficiency.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An apparatus for transferring semiconductor devices in a handler, comprising:
   rectangular frames movably installed on a handler body;
   two linear motors installed on inner sides of two adjacent frames of the rectangular frames, each linear motor comprising a stator and a mover configured to move along the stator;
   a reference pickup member fixed to an inner corner formed where the two adjacent frames meet and configured to pick up a semiconductor device;
   a first pickup member and a second pickup member each coupled to a respective one of said movers and configured to move along a respective one of the rectangular frames;
   a first guide member fixed to the first pickup member and oriented parallel to the respective frame with the second pickup member coupled thereto;
   a second guide member fixed to the second pickup member and positioned in a different horizontal plane than the first guide member;

a third pickup member coupled to both the first and second guide members and configured to move along the second and first guide members in response to movement of the first and second pickup members, respectively;

a position sensing device configured to detect positions of the first and second pickup members before the linear motors are driven, wherein the position sensing device comprises:
  a plurality of sensors installed at predetermined intervals along each of the two adjacent frames and configured to detect positions of the movers; and
  sensing plates extending from the movers toward the plurality of sensors so as to be detected by the plurality of sensors; and a control unit configured to control movements of the movers of the linear motors by detecting displacements of the first and second pickup members when the respective linear motor is driven, wherein the control unit comprises:
  a linear scale fixed to the mover of each of the linear motors; and
  a scanning head fixed to each of the two adjacent frames and configured to encode a numerical value of the linear scale.

2. The apparatus according to claim 1, wherein each of the first and second pickup members comprises:
  a movable block fixed to the mover of the corresponding linear motor; and
  a picker fixed to the movable block and configured to pick up a semiconductor device.

3. The apparatus according to claim 1, wherein the two adjacent frames each include a limit sensor configured to restrict a final position of the first and second pickup members, respectively.

4. An apparatus for transferring semiconductor devices in a handler, comprising:
  a first linear motor installed on a surface of a first frame of the handler;
  a second linear motor installed on a surface of a second frame of the handler, wherein a first end of the first frame is positioned adjacent a first end of the second frame to form an inner corner;
  a first guide member extending in a first horizontal plane from a second end of the first frame;
  a second guide member extending in a second horizontal plane from a second end of the second frame;
  a plurality of pickup members coupled to at least one of the first guide member and the second guide member and configured to move in response to a driving force generated by at least one of the first linear motor and the second linear motor;
  a sensing device configured to detect positions of the first and second pickup members before the respective linear motors are driven, wherein the sensing device comprises:
    a sensing piece coupled to a lower portion of a mover portion of each linear motor; and
    a plurality of sensors provided at predetermined intervals along a lower portion of each of the first and second frames, wherein the plurality of sensors are configured to detect a respective sensing piece before the first and second pickup members are moved; and
  a control unit configured to control the mover portions of the first and second linear motors based on detected displacements of the first and second pickup members, wherein the control unit comprises:
    a linear scale fixed to the mover portion of each of the first and second linear motors; and
    a scanning head fixed to each of the first and second frames and configured to encode a numerical value of the linear scale.

5. The apparatus of claim 4, wherein the plurality of pickup members comprises:
  a first pickup member coupled to the mover portion of the first linear motor and fixed to the first guide member, wherein the first pickup member is configured to move along the first frame when the first linear motor is driven;
  a second pickup member coupled to the mover portion of the second linear motor and fixed to the second guide member, wherein the second pickup member is configured to move along the second frame when the second linear motor is driven; and
  a third pickup member coupled to both the first guide member and the second guide member, wherein the third pickup member is configured to move in response to a movement of the first pickup member or the second pickup member.

6. The apparatus of claim 5, wherein the third pickup member is slidably coupled to the first and second guide members.

7. The apparatus of claim 5, wherein a movement of the first pickup member in a first direction causes a movement of the third pickup member in the first direction, and wherein a movement of the second pickup member in a second direction causes a movement of the third pickup member in the second direction.

8. The apparatus of claim 5, further comprising a reference pickup member fixed to the inner corner formed where the first and second frames meet.

9. The apparatus of claim 5, wherein the first and second pickup members each comprise:
  a moveable block fixed to the mover of the corresponding linear motor; and
  a picker fixed to the moveable block and configured to pick up a semiconductor device.

10. The apparatus of claim 5, further comprising a limit sensor provided on each of the first and second frames, wherein each respective limit sensor is configured to restrict a final position of the first and second pickup members.

11. An apparatus for transferring semiconductor devices, comprising:
  a base plate movably installed on a handler body;
  a reference pickup member fixed to one end of the base plate and configured to pick up a semiconductor device;
  a stator and a mover of a linear motor installed along the base plate;
  a first pickup member fixed to the mover of the linear motor and configured to move horizontally along the base plate;
  a sensing system configured to detect an initial position of the first pickup member, and to continuously monitor a position of the first pickup member as the linear motor is driven; and
  a control unit configured to control movement of the mover based on a detected displacement of the first pickup member, comprising:
    a linear scale fixed to the mover; and
    a scanning head fixed to the base plate and configured to encode a numerical value of the linear scale.

12. The apparatus of claim 11, wherein the sensing system comprises:

a sensing piece coupled to a lower portion of the mover; and a plurality of sensors provided at a lower portion of the base plate and configured to detect the sensing piece before the first pickup member is moved.

13. The apparatus of claim 11, wherein the first pickup member is configured to move along a first frame of the apparatus, and wherein the apparatus further comprises:

a second pickup member coupled to a mover portion of a second linear motor, wherein the second pickup member is configured to move along a second frame of the apparatus when the second linear motor is driven; and a third pickup member, wherein the third pickup member is configured to move in response to a movement of the first pickup member or the second pickup member.

14. The apparatus of claim 13, wherein the first pickup member is fixed to a first guide member which extends in a first horizontal plane from the first frame, the second pickup member is fixed to a second guide member extending in a second horizontal plane from the second frame, and the third pickup member is coupled to both the first and second guide members.

15. The apparatus of claim 14, wherein the third pickup member is slidably coupled to the first and second guide members.

16. The apparatus of claim 15, wherein a movement of the first pickup member in a first direction causes a movement of the third pickup member in the first direction, and wherein a movement of the second pickup member in a second direction causes a movement of the third pickup member in the second direction.

* * * * *